US009754687B2

(12) United States Patent
Yacout et al.

(10) Patent No.: US 9,754,687 B2
(45) Date of Patent: Sep. 5, 2017

(54) ALD COATING OF NUCLEAR FUEL ACTINIDES MATERIALS (71) Applicants: A. M. Yacout, Naperville, IL (US);
Michael J. Pellin, Naperville, IL (US);
Di Yun, Naperville, IL (US); Mike
Billone, Naperville, IL (US)

(72) Inventors: A. M. Yacout, Naperville, IL (US);
Michael J. Pellin, Naperville, IL (US);
Di Yun, Naperville, IL (US); Mike
Billone, Naperville, IL (US)

(73) Assignee: UCHICAGO ARGONNE, LLC,
Chicago, IL (US)

( * ) Notice: Subject to any disclaimer, the term of this patent is extended or adjusted under 35 U.S.C. 154(b) by 519 days.

(21) Appl. No.: 14/017,138

(22) Filed: Sep. 3, 2013

(65) Prior Publication Data
US 2015/0063524 A1 Mar. 5, 2015

(51) Int. Cl.
G21C 3/20 (2006.01)
G21C 3/07 (2006.01)
(Continued)

(52) U.S. Cl.
CPC .............. G21C 3/20 (2013.01); C23C 16/403 (2013.01); C23C 16/405 (2013.01);
(Continued)

(58) Field of Classification Search
CPC ...... G21C 3/60; G21C 2003/045; G21C 3/20;
C23C 16/45525
(Continued)

(56) References Cited

U.S. PATENT DOCUMENTS 3,573,036 A * 3/1971 Fairbanks ................ G21C 3/64
976/DIG. 98
5,180,527 A * 1/1993 Hirai ........................ G21C 3/62
376/421
(Continued)

FOREIGN PATENT DOCUMENTS

WO      02086994      10/2002
WO    2011051447       5/2011

OTHER PUBLICATIONS

Weimer, "ALD Coatings on Gd2O3 Burnable Poison Nanoparticles and Carbonaceous TRISCO Coating Layers", NEUP Project No. 09-765, Nov. 2012.*

Primary Examiner — Jack W Keith
Assistant Examiner — Daniel Wasil
(74) Attorney, Agent, or Firm — Cherskov Flaynik & Gurda, LLC (57) ABSTRACT The invention provides a method of forming a nuclear fuel pellet of a uranium containing fuel alternative to $UO_2$, with the steps of obtaining a fuel form in a powdered state; coating the fuel form in a powdered state with at least one layer of a material; and sintering the powdered fuel form into a fuel pellet. Also provided is a sintered nuclear fuel pellet of a uranium containing fuel alternative to $UO_2$, wherein the pellet is made from particles of fuel, wherein the particles of fuel are particles of a uranium containing moiety, and wherein the fuel particles are coated with at least one layer between about 1 nm to about 4 nm thick of a material using atomic layer deposition, and wherein the at least one layer of the material substantially surrounds each interfacial grain barrier after the powdered fuel form has been sintered.

10 Claims, 5 Drawing Sheets (51) Int. Cl.
 *G21C 21/02* (2006.01)
 *C23C 16/40* (2006.01)
 *C23C 16/455* (2006.01)

(52) U.S. Cl.
 CPC .. *C23C 16/45529* (2013.01); *C23C 16/45555* (2013.01); *G21C 3/07* (2013.01); *G21C 21/02* (2013.01); *Y02E 30/40* (2013.01)

(58) Field of Classification Search
 USPC .................................... 376/414, 422; 427/6
 See application file for complete search history.

(56) References Cited

U.S. PATENT DOCUMENTS

| | | |
|---|---|---|
| 8,084,087 B2 | 12/2011 | Bent et al. |
| 8,318,248 B2 | 11/2012 | Elam et al. |
| 2007/0133733 A1* | 6/2007 | Popa-Simil .............. G21C 3/02 376/409 |
| 2008/0274282 A1 | 11/2008 | Bent et al. |
| 2010/0303193 A1* | 12/2010 | Walters ................... G21C 3/60 376/412 |
| 2011/0033677 A1* | 2/2011 | Shin ....................... B82Y 30/00 427/122 |
| 2012/0207264 A1* | 8/2012 | Van Den Berghe ..... G21C 3/60 376/414 |
| 2012/0263876 A1 | 10/2012 | Haukka et al. |

\* cited by examiner

Prior Art

ALD COATING OF NUCLEAR FUEL ACTINIDES MATERIALS

CONTRACTUAL ORIGIN OF THE INVENTION

The United States Government has rights to this invention pursuant to Contract No. DE-AC02-06CH11357 between the United States Government and UChicago Argonne, LLC representing Argonne National Laboratory.

BACKGROUND OF THE INVENTION

1. Field of the Invention

The present invention relates to a coating applied to powdered nuclear fuel materials prior to sintering.

2. Background of the Invention

The inside of a nuclear reactor is an extremely harsh environment. Temperatures can be as high as 1800° C. at the center of the fuel pellet, and all of the components are exposed to highly corrosive steam.

Neutrons cause fission reactions in typical Light Water Reactors (LWRs). LWRs utilize the energy produced from fission reactions to heat water or steam in the reactor core. This water or steam travels through a heat exchanger to heat clean water into clean steam, and this clean steam turns downstream turbines to produce mechanical energy or motion. The mechanical energy turns a generator which results in the production of electricity.

Figure 1A:
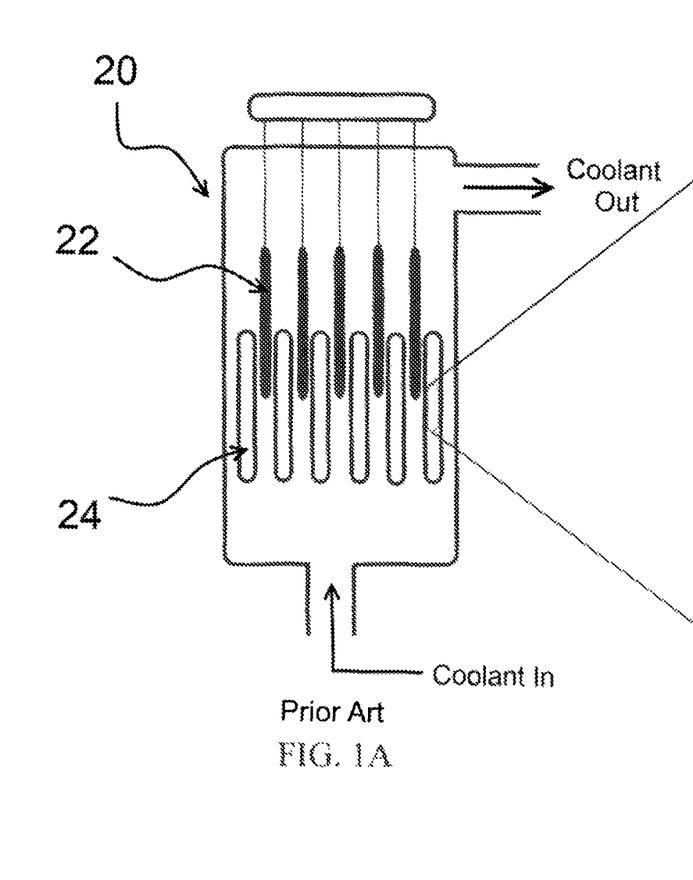
FIG. 1A is a representation of a prior art nuclear reactor core.

A representation of a typical LWR core is depicted in FIG. 1A. A nuclear reactor core 20 contains a series of co-planarly arranged fuel rods 24 between which are positioned control rods 22. The control rods 22 are made of highly neutron absorbent materials such as silver, indium, hafnium, boron, and cadmium. Depending on power requirements called for by the grid, the control rods 22 are either partially or fully inserted or removed to moderate the flux of neutrons, and therefore the amount of fission. This moderation is proportional to the amount of energy produced.

Figure 1B:
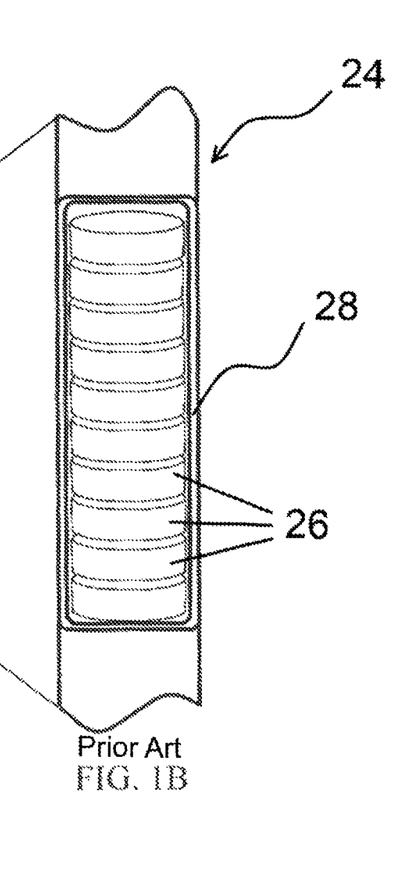
FIG. 1B is a detail, cutaway view of a prior art nuclear fuel rod as depicted in FIG. 1A.
Figure 1C:
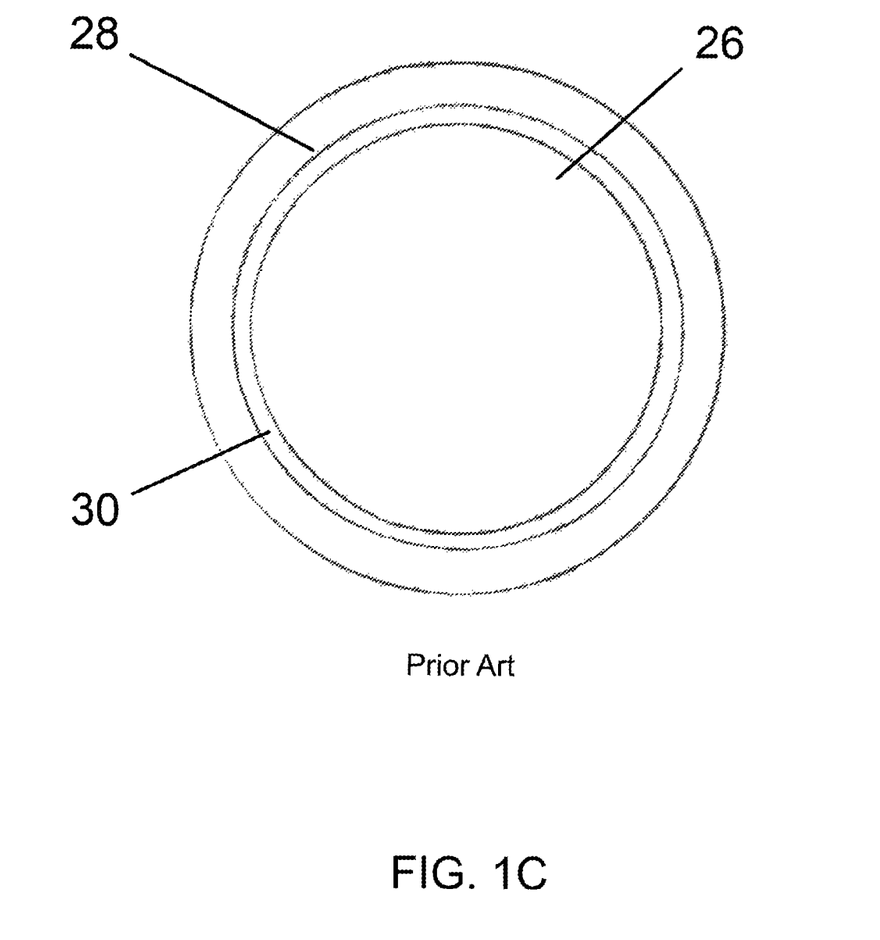
FIG. 1C is a plan view of the nuclear fuel rod of FIG. 1B.

FIG. 1B depicts a detail view of the fuel rods 24, which contain the fissile material, typically in the form of fuel pellets 26. Surrounding the fuel pellets 26 is a cladding layer 28, which is typically made of zirconium or a zirconium alloy. As can be seen in FIG. 1C, a gap 30 between the fuel pellets 26 and cladding 28 must be provided to allow for the expansion of the fuel pellet 26 and the cladding 28. Expansion occurs because of the nuclear irradiation and fuel swelling as a result of the production of fission gases.

Typical fuel pellets are made of sintered uranium dioxide ($UO_2$). The uranium present in the pellets is mostly uranium-238, which has been enriched to contain approximately three percent uranium-235. The uranium-235 is the major fuel of the LWR, but the uranium-238 is fissionable and produces plutonium-239, which also fuels the LWR. In some reactors, the pellets are made of both uranium and plutonium oxides and are referred to as mixed oxide fuels.

One particular problem facing state of the art fuel pellets 26 is the heat conduction from the center of the pellet 26 to the exterior of the cladding 28. The heat conduction of uranium dioxide is poor relative to that of the cladding material. This can cause high heat build-up within a fuel rod, leading to failure. Temperatures at the center of the pellet can reach 1800° C. inasmuch as the heat has nowhere to dissipate. This is because heat conduction of uranium dioxide is 5 W/mK (where mK is meters-Kelvin), while the heat conduction of its surrounding, yet physically remote zirconium cladding is 35 W/mK. The poor heat conduction is exacerbated by the expansion gap 30 between the pellet 26 and the cladding 28.

Several other fuel forms exist besides uranium dioxide, such as uranium nitride (UN), uranium carbide (UC), uranium-zirconium hydrides, and uranium-molybdenum alloys, among others. These fuel forms have significant advantages over uranium dioxide in terms of the uranium density in the pellet, heat conduction. The invention improves fission gas control, fuel/cladding interactions and high temperature behavior. Despite the excellent properties of these metallic fuels, they have yet to see any great market penetration because of their inferior corrosion resistance.

In loss-of-coolant-accidents (LOCA), the corrosion resistance of all the reactor components is crucial because any water remaining in the vessel will heat up and turn to high-pressure steam. This high-pressure steam will oxidize many of the reactor core components, including the fuel pellets. State of the art uranium dioxide fuel pellets are resistant to oxidation because they are already oxidized. However, oxidation of the alternative fuel forms mentioned will create hydrogen gas, which is likely to result in an explosion. Hydrogen explosions can be devastating to reactor containment as evidenced by the disaster in 2011 in Fukushima, Japan in which a hydrogen explosion literally blew the roof off of a containment building.

In order to increase safety in the event of a LOCA, uranium dioxide fuel pellets are predominantly used at the expense of increased fuel density and thermal conductivity. The alternative fuel forms all have higher thermal heat conductivities at operational temperatures (approximately 300° C.): uranium nitride—15.5 W/mK; uranium carbide—20.9 W/mK; uranium-zirconium hydrides—18.1 W/mK; and uranium-molybdenum alloys—23 W/mK. Moreover, these materials have thermal conductivities that increase with increasing temperature. Unfortunately, because of the hydrogen production risk, these fuel forms cannot be used in current LWRs.

Another problem facing alternative fuel forms is that they are relatively difficult to sinter. The alternative fuel forms mentioned are refractory materials, that is, they retain their strength even at high temperatures. While this is desirable in the final product, the retained strength requires extraordinarily high temperatures and pressures in the sintering process. Often sintering agents are used, but mixing the powders uniformly is difficult and can require several days.

Some efforts have been undertaken to remedy these problems, but these efforts have failed to provide adequate solutions. One attempt involved encapsulating the entire sintered fuel pellet in a coating. However, a single defect in the coating could lead to catastrophic failure because the whole pellet could oxidize from the single point. Another attempt has been made to supplement the powdered fuel form with additives. In doing so, the advantage of the increased uranium density is lost because the volume of additives necessary to aid sintering is larger than the increase in fuel density achieved by using the alternative fuel form. Finally, attempts have been made to add powders of materials with lower melting temperatures so that those powders will melt and wet each fuel grain during the sintering process. Nevertheless, a complete barrier to corrosion resistance is not created because the liquid metal will not surround every grain barrier.

A need exists in the art to make available alternative nuclear fuel forms so that their superior properties can be utilized. In normal operation, these fuel forms would allow for increased efficiency by allowing for increased heat conduction. In that manner, more energy from each fission reaction can be transferred to the coolant water and thereby to the turbines and generators.

SUMMARY OF THE INVENTION

An object of the present invention is to increase the density of uranium in nuclear fuel pellets. A feature of the present invention is the ability to utilize alternative fuel forms such as uranium nitride, uranium carbide, uranium-zirconium compounds, and uranium-molybdenum alloys. An advantage of the present invention is that more uranium is present to take part in fission reactions, which increases the amount of usable energy produced by each fuel pellet.

Another object of the present invention is to provide a method of coating alternative nuclear fuel forms so that they will not produce hydrogen when exposed to high pressure steam. A feature of the present invention is the ability to select coating layers that are oxygen diffusion barriers. An advantage of the present invention is that the superior properties of the alternative fuel forms can be utilized without compromising the safety of the reactor.

Yet another object of the present invention is to increase the ease with which alternative fuel forms can be sintered. A feature of the present invention is the coating that surrounds each powder grain. An advantage is that the coating improves the sinterability of the alternative fuel forms by providing a cohesive medium which binds the powdered fuel forms. Another advantage is that film failure causes minimal disruption inasmuch as a "film" comprises the coating of a single grain (about 10-50 microns in diameter), therefore minimal hydrogen gas production occurs.

Still another object of the present invention is to improve the heat conduction throughout the fuel pellet. A feature of the present invention is that many of the alternative fuel forms have thermal conductivities greater than uranium dioxide. An advantage of the present invention is that better heat dissipation can occur, preventing the build-up of heat in the fuel rod, thereby increasing reactor efficiency.

Still another object of the present invention is to minimize interactions between the fuel and cladding. A feature of the present invention is that the coating layers prevent the fuel material from contacting the cladding, thereby preventing the fuel from dissolving into the cladding. An advantage of the present invention is that the possibility of a containment breach and escape of radioactive materials is minimized.

The present invention provides a method of forming a nuclear fuel pellet, the method comprising the steps of obtaining a fuel form in a powdered state; coating the fuel form in a powdered state with at least one layer of a material; and sintering the powdered fuel form into a fuel pellet.

Further, the present invention provides a sintered nuclear fuel pellet, wherein said pellet is made from a powdered fuel form, wherein the powdered fuel form is coated with at least one layer of a material, and wherein the at least one layer of the material substantially surrounds each interfacial grain barrier after the powdered fuel form has been sintered.

BRIEF DESCRIPTION OF THE DRAWINGS

The invention together with the above and other objects and advantages will be best understood from the following detailed description of the preferred embodiment of the invention shown in the accompanying drawings, wherein.

DETAILED DESCRIPTION OF THE INVENTION

The foregoing summary, as well as the following detailed description of certain embodiments of the present invention, will be better understood when read in conjunction with the appended drawings.

As used herein, an element step recited in the singular and preceded with the word "a" or "an" should be understood as not excluding plural said elements or steps, unless such exclusion is explicitly stated. Furthermore, the references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

The present invention provides a way for the superior properties of alternative fuel forms to be utilized in LWRs in a manner safe from the harmful effects of oxidation. These alternative fuel forms allow for greater fuel density, decreased fuel/cladding interaction, and improved thermal conductivity. For example, the invented method provides fuel pellets with uranium densities of approximately 90 percent or higher, with about a 10 percent void fraction.

Providing a safe way to use these alternative fuel forms allows for an increase in the efficiency of LWRs by the more effectively transferring the heat generated in the fission reactions to the coolant water. Moreover, the buildup of heat in the fuel pellet is minimized, which reduces the chance of fuel melting during a LOCA.

In brief, the present invention accomplishes these objectives through the use of a coating around the powdered fuel form prior to sintering. The coating is applied via atomic layer deposition (ALD). This process creates a uniform and substantially defect free coating on each individual powder grain. The coating not only aids in the sintering process, but it also shields the alternative fuel forms from oxidation after sintering.

A salient feature of the invention is that the coatings on each individual fuel grain are no more than about 5 microns thick. As this creates approximately 10 microns of space between the particles, thicker coatings should be not be utilized so as to avoid a large drop in fuel density. Single coating coverage provides enhanced sintering (by reducing sintering temperature), elasticity, and smaller fuel density impact. The inventors found that thinner coatings confer elasticity to them and to the underlying substrate. Further, the effect of several thin layers instead of a single thick layer results in an additive effect of the elasticity of eachof those thin layers. Multi-coating coverage of single grains provides a means to control fuel burn rate (via the introduction of dopants or quenchers) and also a means to control clad pellet interaction.

ALD is a sequential, self-limiting synthesis technique that allows conformal coating of large areas and complex shapes. ALD is sequential because alternating precursors are introduced to the substrate, forming a layer over the substrate one atom thick. The second precursor is introduced, which reacts with the first precursor, again forming another layer that is a single atom thick. ALD is self-limiting because the precursors wet the entire substrate surface. When the second precursor is introduced, the reaction with the first precursor proceeds until there is no available reaction area. The remainder of the precursor is pumped away.

Several embodiments exist to produce the alternative fuel forms. In one embodiment, formation of uranium carbide is done through a partial carbothermic reduction in an inert (e.g. argon) atmosphere at a temperature greater than about 1400° C. for about ten to twenty hours according to the following formula:

$$UO_2 + 6C \rightarrow 2UC + UO_2 + 4CO$$

In another embodiment, uranium nitride is made through a full carbothermic reduction by exposing the uranium carbide and uranium dioxide produced in the above equation to a nitrogen atmosphere according to the following formula:

$$4UC + 2UO_2 + 3N_2 \rightarrow 6UN + 4CO$$

Ammonolysis is another method of uranium nitride production in which uranium tetrafluoride (an intermediate produced in the formation of uranium dioxide from uranium hexafluoride) is exposed to ammonia gas at high temperatures and pressures. The nitrogen group in the ammonia replaces the fluoride ions, and the fluoride ions react with the hydrogen to create hydrogen fluoride gas.

Uranium nitride can also be formed by hydriding the uranium followed by nitiriding the hydrated compound according to the following sequence:

$$2U + 3H_2 \xrightarrow{>280° C.} 2UH_3$$
$$2UH_3 + 1.5N_2 \xrightarrow{\sim 500° C.} U_2N_3$$
$$U_2N_3 \xrightarrow{>500° C.} UN + 0.5N_2$$

Some of the alternative fuels are mixed metal compounds or metal alloys. Uranium-zirconium fuels typically take the form of a combination of uranium hydride and zirconium(II) hydride. Uranium-molybdenum fuels are made from alloys of 90 wt % uranium and 10 wt % molybdenum. These alloys can be dispersions or monolithic (i.e, a solid piece).

After the raw materials are produced, they are formed into a powder 32 before being sintered. The creation of powders 32 can be done through several techniques: ball milling, atomization and water atomization, centrifugal disintegration, and precipitation from aqueous solutions. A preferred method of powder production for metallic fuels is by atomization.

Figures 2A, 2B:
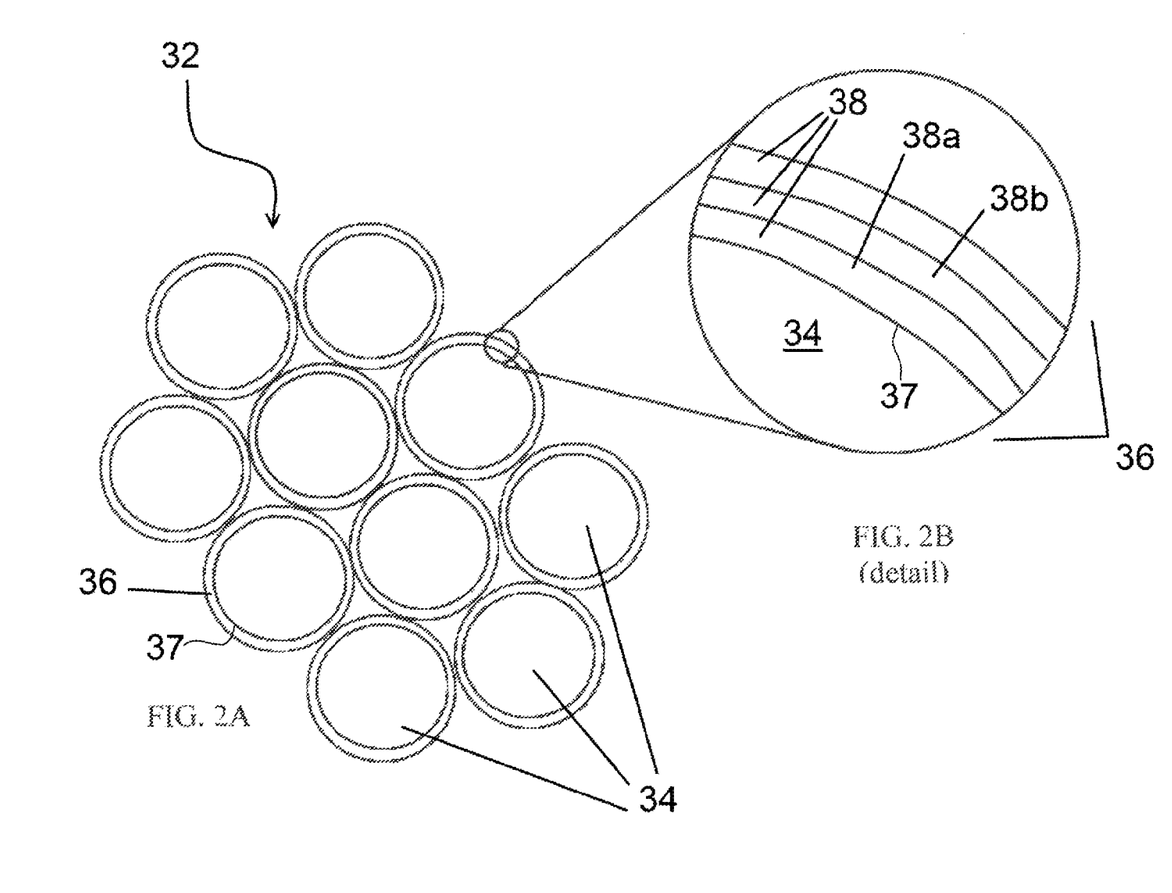
FIG. 2A is a representation of a coating on a powdered fuel form prior to sintering in accordance with features of the present invention.
FIG. 2B is a detail view of the coating of FIG. 2A.

Once the powder 32 is obtained, each grain 34 receives a coating 36 of a protective material or materials, creating an interfacial grain barrier 37 between the grain 34 and the coating 36. Several protective materials could serve individually or collectively as the coating 36. As can be seen in FIG. 2B, the coating 36 is comprised of three layers 38.

For the purposes of description and by way of example, the deposition of a first alumina layer 38a and a second zirconium dioxide layer 38b on grain 34 is provided herein for illustration. These coatings have suitable precursors, and both coatings have desirable properties. The alumina layer 38a is a means for preventing the rapid oxidation of the alternative fuel form by acting as a barrier to oxygen diffusion into the bulk material. As noted supra, the rapid oxidation of the alternative fuel results in hydrogen gas generation. The zirconium dioxide layer 38b provides a means to protect the alumina layer 38a from high temperature water dissolution.

The combination of alumina and zirconium dioxide provides other synergistic results. For instance, the water stable tetragonal phase of zirconium dioxide spontaneously forms when deposited on alumina if the layers are approximately 80 nanometers thick. Ordinarily, creating the tetragonal phase would require careful annealing. However, the interfacial strain between the crystalline structures of the layers controls the zirconium dioxide morphology. Creating the tetragonal zirconium dioxide can also be aided by adding minor impurities, such as yttrium.

Figure 3A:
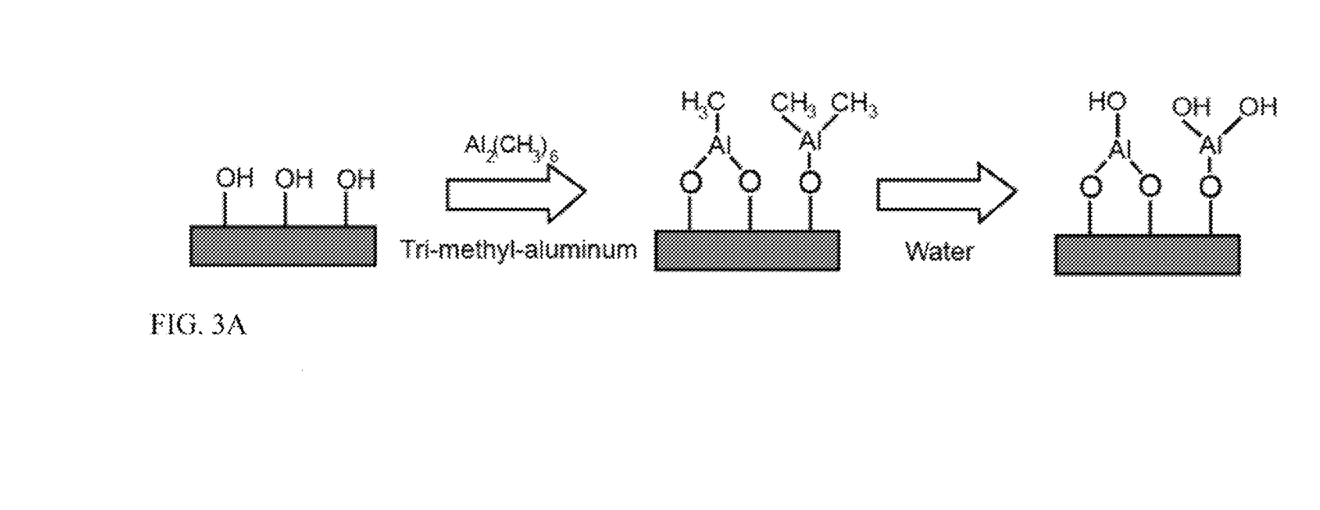
FIG. 3A is a depiction of an initial atomic layer deposition surface reaction on a grain of powder.

FIG. 3A depicts the chemistry occurring on the surface of each grain of a fuel material to be coated via the invented method. The precursors mentioned in this example are not intended to be limiting and are only illustrative of one way that the reaction sequence could take place.

The surface of each grain 34 is either selected or otherwise prepared to contain hydroxyl groups. Surface preparation can be as minor as exposure to air as covalent hydroxyl groups will spontaneously generate upon exposure to air. A first precursor, tri-methyl-aluminum ($Al_2(CH_3)_6$), is passed over the grains 34. After the tri-methyl-aluminum has had sufficient time to cover and react with the surface (approximately ten seconds), the remainder is evacuated from the reaction environment. The tri-methyl-aluminum reacts with the hydroxyl group creating a bond between the surface oxygen and aluminum. One or two methane leaving groups are produced in the reaction.

Upon creation of the di-methy- or methyl-aluminum moiety, the reaction environment is flushed, replaced, or otherwise neutralized. A suitable replacement means is a relatively inert gas, such as nitrogen, helium, or argon. After reaction environment neutralization, water is then introduced into the atmosphere in an amount and for a time sufficient to react with the remaining methyl groups. The water reaction generates further methane leaving groups, which are substituted by hydroxyl moieties. The reaction environment is then replaced with an inert gas again.

The net result of the reaction sequence is the deposition of alumina layer 38a on the grain 34. After this first reaction sequence, another alumina layer 38a could be deposited by using the same precursors, or a layer 38 of another material can be deposited.

Figure 3B:
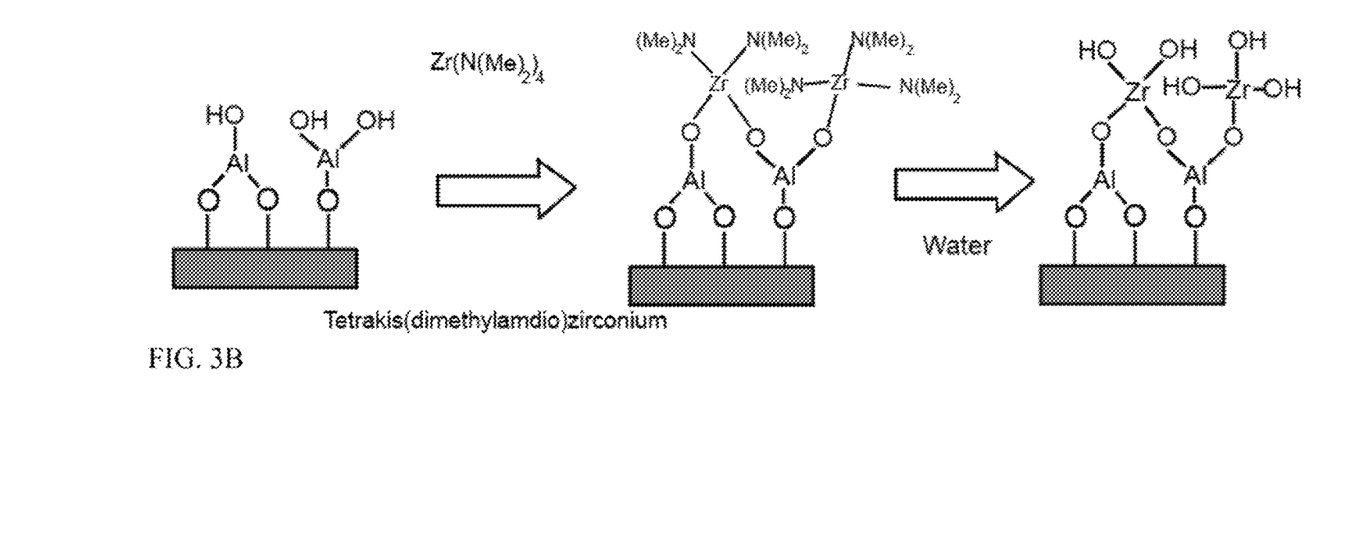
FIG. 3B is a depiction of the second atomic layer deposition surface reaction on a grain of powder.

FIG. 3B shows the second ALD reaction sequence of this example. After the initial deposition, there are leftover hydroxyl moieties on the surface of the alumina layer 38a. The hydroxyl groups react with the second reaction's first precursor, tetrakis(di-methyl-amido)zirconium, which results in the generation of di-methyl-amine leaving groups.

Upon creation of the tris(di-methyl-amido)zironcium or bis(di-methyl-amido)zirconium moieties, the reaction environment is replaced with an inert gas. After reaction environment neutralization, water is then introduced into the atmosphere in an amount and for a time sufficient to react with the remaining tris(di-methyl-amido)zironcium or bis (di-methyl-amido)zirconium. This water reaction generates more di-methyl-amine leaving groups, which are substituted by hydroxyl moieties. The reaction environment is then replaced with an inert gas again.

The net result of the second reaction sequence is the deposition of a zirconium dioxide layer 38b. At this point, another alumina layer 38a or zirconium dioxide layer 38b could be deposited, but any number of other materials and layers 38 could also be chosen. FIG. 2B shows four deposited layers 38, but the number of layers 38 can be lesser or greater, depending on the desired properties.

Several other materials have properties that would be desirable as coatings around the grains 34. Some representative examples are: zirconium nitride (ZrN), zirconium hydride ($ZrH_2$), silicon nitride ($Si_3N_4$), silicon dioxide ($SiO_2$), aluminum nitride (AlN), silicon carbide (SiC), gadolinium oxide (GdO), titanium nitride (TiN), magnesium oxide (MgO), calcium oxide (CaO), and elemental zirconium, molybdenum, and silicon. $ZrH_2$ and GdO are examples of burnable poisons and molybdenum is an example of a refractory material.

When determining the number of layers 38 to deposit on the grains 34, an important consideration is to not overcome the increase in fuel density provided by the alternative fuel form chosen. For instance, a fuel pellet using uranium nitride results in a 30% increase in uranium fuel density. Therefore, the number of layers 38 applied should not exceed 30% of the volume of the fuel pellet 26. If the volume percentage of layers 38 applied were to exceed the increase in fuel density percentage, then no benefit would inure from selecting a fuel form with a higher fuel density. Each layer 38 deposited will be about 1-4 nm thick. If the initial size of the grain 34 is relatively large, then more layers 38 can be deposited without significantly impinging upon the increase in fuel density.

Figure 4:
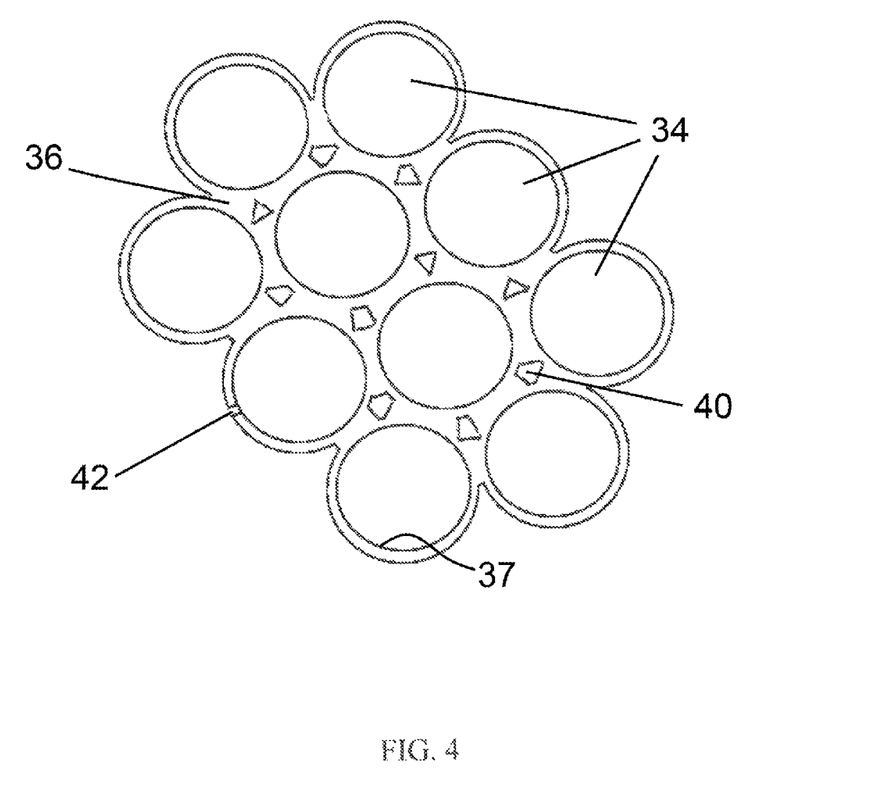
FIG. 4 is a representation of the powdered fuel form of FIG. 2 after sintering.

After the coating 36 has been applied to the grains 34, the powder 32 is ready for sintering. Coating the individual grains before pressing minimizes pinhole development. FIG. 4 shows individual fuel cell particles 34 sintered together. The coating 36 provides the cohesive medium by which the grains 34 of the powder 32 can be held together. As can be seen in FIG. 4, the coating 36 substantially surrounds each grain 34, shielding it from oxygen, steam, and water. In an embodiment of the invention each grain is completely enveloped by the coating so as to be physically separated from the atmosphere in which the sintered monolith exists. Inherent to the sintering process is the formation of pores 40, where the coating 38 did not completely coalesce.

Even if a defect 42, such as a crack, develops after sintering, only a single grain 34 would be subject to oxidation. Oxidation of a single grain 34 would not produce the amount of hydrogen gas necessary for an explosion or any other catastrophic failure. This is an advantage over other coating efforts because a single defect 40, or even multiple defects 40, would only affect individual grains and not subject the entire fuel pellet to oxidation.

Several advantages inhere in the present invention. One of the greatest advantages is that the invention enables the use of alternative fuel forms in LWRs in which the high pressure water and steam would otherwise cause oxidation of the alternative fuel forms. These alternative fuel forms have higher fuel densities compared to uranium dioxide. Uranium dioxide has a fuel density of approximately 55% uranium by volume. Uranium nitride, uranium carbide, and uranium-molybdenum alloys have fuel densities of 74%, 68%, and 83% of uranium by volume, respectively. Uranium-zirconium hydrides actually have a lower volume percent of uranium at 45%. However, the hydrogen in the fuel acts as an additional neutron moderator and allows for displacement of a portion of the moderator with fuel, which effectively increases the power density.

Another advantage is the increased thermal conductivity. All of the alternative fuel forms have thermal conductivities higher than uranium dioxide. Uranium dioxide has a thermal conductivity of approximately 5 W/mK at operational temperatures. Uranium nitride, uranium carbide, uranium-zirconium hydrides, and uranium-molybdenum alloys have conductivities of 15.9 W/mK, 20.9 W/mK, 18 W/mK, and 23 W/mK, respectively. The increased thermal conductivity improves both the safety and the efficiency of the reactor.

Another advantage is the ability of ALD to uniformly coat large surface areas with aspect ratios of 10,000:1. To coat every grain 34 adequately, the powder 32 will have to be spread out over a large surface in a thin layer, so that as much of the grains are exposed to the precursors as possible. ALD also allows for multiple layers 38 to be built upon one another. In this way, particular layers can be added to prevent migration of fission byproducts or to minimize fuel/cladding interaction. Further, ALD provides thin film coatings, which perform better than thick coatings when exposed to thermal stresses. As stated above, ALD deposits layers that are one atom or molecule thick, and the number of layers deposited is easily controlled.

Additionally, ALD coatings have the ability to trap fission gases in the fuel pellet 26. The fission gases otherwise cause fuel swelling, which is one of the reasons necessitating the gap 30. The layers 38 create a barrier against aggregation of fission gases. If the gases cannot aggregate, then they cannot create the buildup of sufficient pressure to cause swelling. In the absence of swelling, the danger of fuel/clad interaction can be greatly reduced, increasing the life of the fuel. Thus, the barrier created by the layer(s) provides a means to extend the life of the fuel. This eliminates the need for practitioners to optimize burn rates and fuel utilization by trying to arrive at a no burn poison presence when very little fuel is remaining in the pellet.

ALD is uniquely suited to deposit burnable poisons to the fuel pellet 26. A burnable poison is a high neutron absorbing material used to control the energy production of the pellet 26. The term "burnable" means that the absorbers will be consumed through fission into low absorbing materials after absorbing a neutron. The use of burnable poisons in prior art fuel pellets fails to provide the uniformity of mixing inherent to the ALD process. Prior art pellets had different concentrations of burnable poisons at different regions of the pellet because powder mixtures are not able to achieve the level of homogeneity of the gaseous and liquid precursors used in ALD. Therefore, burnable poisons deposited by ALD provide more even fuel production control than their prior art predecessors.

The fuel pellets 26 of the present invention also have the advantage that they can be used with currently operating LWRs. The fuel pellets 26 can simply replace the currently used sintered fuel pellets. There would not have to be any retrofitting of equipment to accommodate the switchover to the present invention.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting, but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. §112(f) unless and until such claim limitations expressly use the phrase "means for" followed by a statement of function void of further structure.

The present methods can involve any or all of the steps or conditions discussed above in various combinations, as desired. Accordingly, it will be readily apparent to the skilled artisan that in some of the disclosed methods certain steps can be deleted or additional steps performed without affecting the viability of the methods.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," "more than" and the like include the number recited and refer to ranges which can be subsequently broken down into subranges as discussed above. In the same manner, all ratios disclosed herein also include all subratios falling within the broader ratio.

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

The embodiment of the invention in which an exclusive property right or privilege is claimed is defined as follows:

1. A sintered nuclear fuel pellet, wherein said pellet includes particles of fuel, wherein each of the particles comprises a uranium containing moiety,
    wherein the uranium containing moiety is selected from the group consisting of uranium nitrides, uranium carbides, uranium-zirconium hydrides, uranium-molybdenum alloys, and combinations thereof,
    wherein said pellet includes an atomic layer deposition (ALD) provided coating on the particles,
    wherein the coating comprises at least one layer of material,
    wherein the at least one layer is about 1 nm to about 4 nm thick,
    wherein the at least one layer of material is a metal-containing compound selected from the group consisting of alumina, zirconium oxide, silicon carbide, silicon dioxide, magnesium oxide, zirconium nitride, zirconium hydride, silicon nitride, aluminum nitride, zirconium, molybdenum, silicon, gadolinium oxide, titanium nitride, calcium oxide, and combinations thereof, and
    wherein the at least one layer of the material substantially surrounds each particle before and after the particles have been sintered.

2. The fuel pellet of claim 1 wherein the volume percent of the at least one layer of material is no more than 30% of the volume of the fuel pellet when the uranium containing moiety is uranium nitride.

3. The fuel pellet of claim 1 wherein the volume percent of the at least one layer of material is no more than 20% of the volume of the fuel pellet when the uranium containing moiety is uranium carbide.

4. The fuel pellet of claim 1 wherein each of the particles is coated with a plurality of layers of material.

5. The fuel pellet of claim 1 wherein each of the particles is coated with a plurality of layers of material wherein the volume percent of the plurality of layers of material is no more than 20% of the volume of the fuel pellet.

6. The fuel pellet of claim 1 wherein the sintered fuel pellet has a uranium density of approximately 90%.

7. The fuel pellet of claim 1, wherein the coating is uniform.

8. The fuel particle of claim 4 where each of the plurality of layers of material comprises a different material.

9. The fuel particle of claim 5 wherein each of the plurality of layers of material comprises a different material.

10. The fuel particle of claim 1 wherein each of the particle is coated with a plurality of layers of material wherein the volume percent of the plurality of layers of material is no more than 30% of the volume of the fuel pellet.

* * * * *